May 4, 1954 E. M. BRADBURD ET AL 2,677,809

ELECTRICAL WAVE FILTER

Filed Oct. 10, 1949 3 Sheets-Sheet 1

INVENTORS
ERVIN M. BRADBURD
ROBERT S. ALTER
BY R. P. Morris
ATTORNEY

INVENTORS
ERVIN M. BRADBURD
ROBERT S. ALTER
BY R. P. Morris
ATTORNEY

INVENTORS
ERVIN M. BRADBURD
ROBERT S. ALTER
BY R. P. Morris
ATTORNEY

Patented May 4, 1954

2,677,809

UNITED STATES PATENT OFFICE 2,677,809

ELECTRICAL WAVE FILTER

Ervin M. Bradburd, Fairlawn, and Robert S. Alter, Clifton, N. J., assignors to International Standard Electric Corporation, New York, N. Y., a corporation of Delaware Application October 10, 1949, Serial No. 120,496

1 Claim. (Cl. 333—73)

This invention relates to wave filters and more particularly, to those filters employing transmission line sections of the coaxial type as component impedance elements.

It is the principal object of this invention to provide a vestigial, or quasi-single, sideband filter for use in communication systems or the like where high frequency equipment is employed. In particular the filter of this invention is ideally suited for the requirements of television transmission.

It is necessary in television transmission in order to conserve spectrum and reduce bandwidth requirements at the receiver that the transmitter conform to a vestigial, or quasi-single, sideband characteristic. At the present time there are two methods in use for obtaining this vestigial sideband characteristic. The R.-F. coupling networks following the modulated radio frequency stage can be designed to attenuate the undesired sideband, or a filter can be placed at the output of the transmitter to achieve the desired result. In this latter class, in which the subject matter of this invention properly belongs, the complexities of filter design are eliminated from all circuits containing tubes or replacement elements. This is a very great advantage since it permits readjustment of all circuits, necessitated by the replacement of a tube for instance, primarily on the criteria of maximum output, thereby simplifying the tuning procedure.

Filters of the class described which are known have been for the most part of complex design both mechanically and electrically, bulky in size and weight and of the type necessitating individual installation tuning.

In accordance with this invention there is provided a filter of the class described which possesses improved operational characteristics and which eliminates to a great extent these disadvantages of known filters.

The above-mentioned and other features and objects of this invention and the manner of attaining them will become more apparent and the invention itself will be best understood, by reference to the following description of an embodiment of the invention taken in conjunction with the accompanying drawings, wherein.

Figure 1:
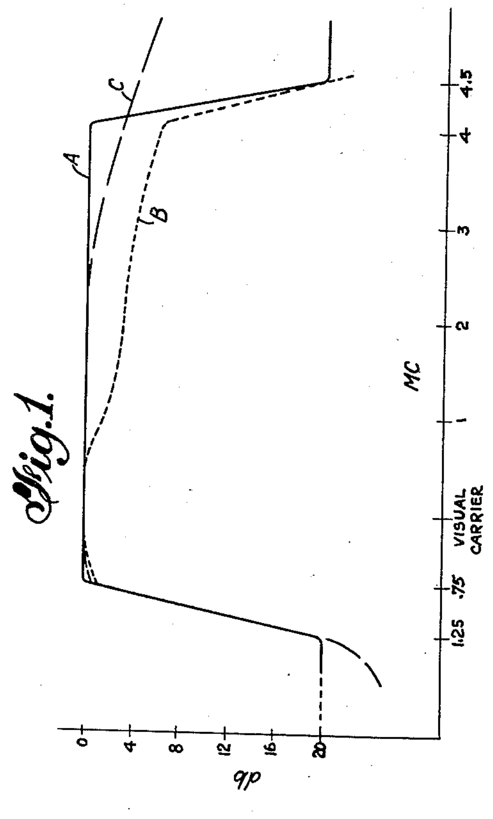
Figure 1 is a frequency response curve illustrating the theoretical, the allowable deviation from the theoretical and the practical plot of a vestigial sideband characteristic.

With reference to Figure 1, the solid line curve A illustrates the ideal sideband characteristic curve as specified by the F. C. C. for television transmission, while the dotted curve B indicates the total allowable system deviation from the ideal curve. Two important factors are illustrated by this plot, one is that the signal must be attenuated at least 20 db at frequencies more than 1.25 megacycles per second below the visual carrier frequency and the other is that the response between −0.75 megacycle per second and 4 megacycles per second (with respect to the visual carrier) must be essentially flat.

In order to obtain the sharp cut-off characteristic required, a ladder network or a lattice network can most feasibly be employed. However, the values of reactances in the arms of lattice networks are very critical making extremely accurate tuning necessary. This of course, is not desirable. In addition since the lattice network is essentially a balanced type of circuit and since the use of coaxial lines in a balanced circuit introduces many complexities, it may be seen that the ladder type network would offer the most desirable configuration for this type of filter.

Among the ladder structures available for this application are the constant resistance and the conventional pure reactance type of circuit.

The constant resistance network absorbs the energy of the rejected band in a resistor and the energy of the pass band is delivered to the load. Inasmuch as all the incident energy is absorbed in the filter structure, a properly designed network of this type presents a constant input resistance to the generator over both the reject and pass bands. However the constant resistance filter is inherently more complicated than the purely reactive network because it actually consists of two filters in series or parallel, that is, one for the pass band energy and one for the stop band energy.

On the other hand, the conventional pure reactance network reflects the energy in the reject band for all purely reactive four terminal networks. This reflected energy in the stop band can be absorbed by the generator. If a short length of coaxial line is used to connect the generator and the filter, the echoes produced by the rejected energy are not perceptible and since the rejected power is relatively small, it is readily absorbed in the output stage of the transmitter without placing an undue strain on the transmitter.

From the above consideration it may be seen that the purely reactive structure is inherently suited to perform the required filtering in the most economical and efficient manner. For this reason the embodiment of the invention to be considered here is that of a ladder type network of pure reactance employing the use of one or more $m$-derived sections to obtain the sharp cut-off characteristic with a small attenuation in the pass band.

In order to understand the physical structure of the filter, it is first necessary to give some consideration to the electrical equivalent circuit of the configuration employed.

Figure 2:
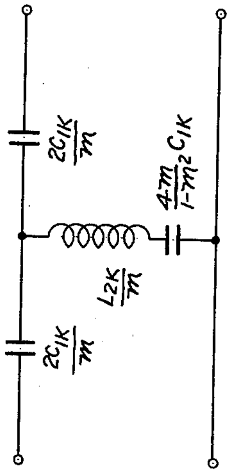
Figure 2 is a schematic diagram of an *m*-derived high pass T section used in the development of the invention.

With reference to Figure 2, there is shown the schematic diagram of the $m$-derived high pass filter. The values of the condensers and inductances in the configuration of Figure 2 are conventionally given in terms of the prototype values or for the case where $m=1$ (constant-$k$ network) as follows:

$$C_{1k}=\frac{1}{4\pi f_c Z_c}$$

$$L_{2k}=\frac{Z_c}{4\pi f_c}$$

where $Z_c$ is the nominal characteristic impedance of the filter and $f_c$ is the cutoff frequency of the filter and is equal to the visual carrier frequency minus approximately 1.0 megacycle per second.

The value of $f_c$ would of course vary depending upon the channel for which the filter is adjusted. To obtain the sharp cut-off, a frequency of infinite attenuation is placed just below the cut-off frequency and the value of $m$ for this section is then determined through the use of the equation:

$$m=\sqrt{1-\left(\frac{f_\infty}{f_c}\right)^2}$$

where $f_\infty$ is set equal to the carrier frequency minus approximately 1.5 megacycles per second. From this equation it may be seen that for channels in the high band (174 to 216 megacycles per second) the value of $m$ is approximately equal to 0.07 and for the low band 0.15.

Knowing the value of $m$, $L_{2k}$ and $C_{1k}$, the required series and shunt condensers, and the shunt inductance can be calculated.

The next factor to be considered is the selection of terminating networks so that losses due to mismatch are minimized. There are two points at which mismatch may occur assuming that the theoretical values of the $m$-derived filter can be achieved in practice, i. e. there is no mismatch between sections or terminating networks. One such point is between the generator output and the filter input and the other is between the filter output and the antenna system. The generator line and antenna both represent a resistive impedance so that if the filter also represented this value of resistance as its terminals a perfect match would be achieved and no losses incurred. However, the $m$-derived network for certain values of $m$ has a characteristic impedance which is far from uniform in its pass band and hence poor matching would be obtained to a constant resistance load over the pass band.

In order to reduce the mismatch between filter and generator or load, an approximate terminating network must be utilized. This network serves the function of minimizing the variation of the characteristic impedance of the filter in a particularly frequency band. In effect, these networks are matching circuits coupling the filter with the constant impedance generator line and the load.

Figure 3:
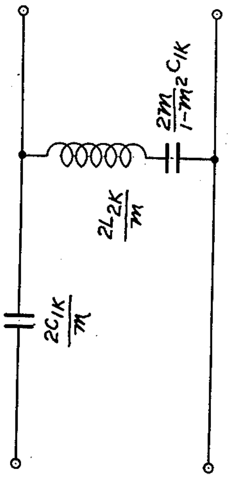
Figure 3 is a schematic diagram of an *m*-derived terminating half section matching network used in the development of the invention.

In Figure 3 there is shown the schematic diagram of the conventional T terminating half section for an $m$-derived filter. It can be shown that for a perfect match the generator and load impedance W at any particular frequency should be equal to:

$$W=Z_c\left(\frac{1+X_k(1-m^2)}{\sqrt{1-|X_k|}}\right)$$

where $X_k$ is equal to $-(f_c/f)2$.

From a plot of W versus frequency over a typical TV channel we are able to arrive at that value of $m$ which provides the best overall matching network. Once having determined the optimum terminating networks, it is necessary to ascertain the number of filter sections required to give the desired cut-off characteristic. It is known that maximum attenuation of the lower side band should occur at the adjacent channel sound carrier frequency which is below the visual carrier frequency. It is also necessary to attentuate all energy in the frequency band 1.25 megacycles per second below the visual carrier by at least 20 db, as was previously shown in this discussion with reference to Figure 1.

The attenuation of two terminating half sections and the $m$-derived section can be calculated through the use of the following expression:

$$\alpha= 20 \log_{10}\left(\frac{Y_k+m}{Y_k-m}\right)$$

where $$Y_k=1-\frac{1}{|X_k|}$$

and $\alpha$ of course equals the attenuation of a full $m$-derived section.

Figure 4:
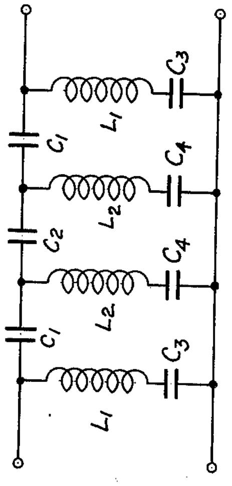
Figure 4 illustrates schematically, a composite filter arrangement of the sections shown in Figures 2 and 3.

From a plot of attenuation versus frequency for the composite arrangement it may be shown that the filter configuration shown in Figure 4 containing two terminating half sections and two filter sections gives a most satisfactory vestigial side band characteristic.

The values of inductances and capacitances are such that they can be obtained only with transmission line elements, therefore, it is necessary to translate this theoretical filter into a practical and efficient mechanical arrangement.

Figure 5:
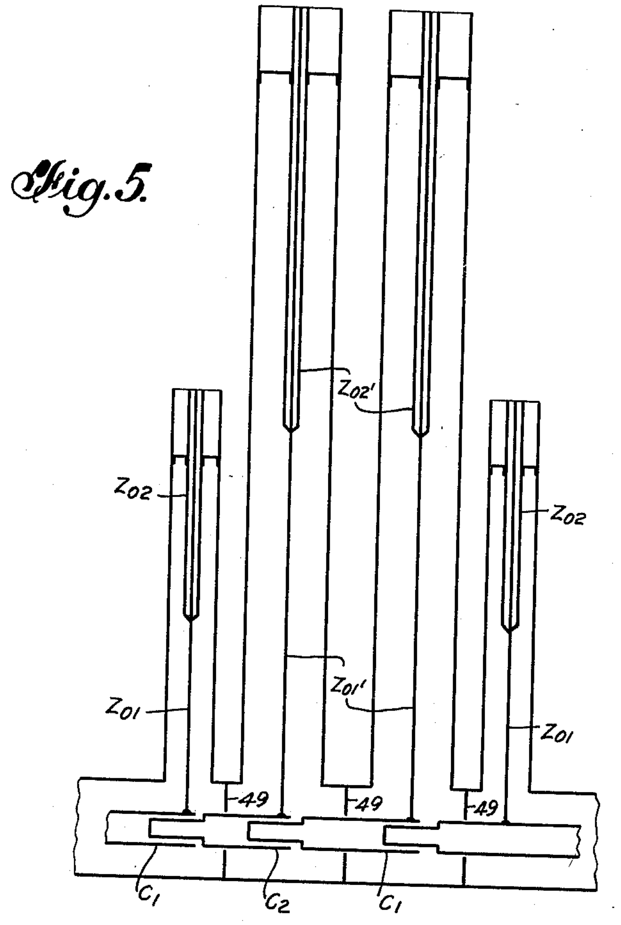
Figure 5 is a schematic representation of the physical arrangement of the vestigial sideband filter forming the embodiment of the present invention.

The general arrangement of the filter of this invention is shown schematically in Figure 5 wherein like elements of Figure 4 are designated by the same reference characters.

The elements used in the series arms are the condensers $C_1$, $C_2$ and $C_3$, the construction of which will be covered at a later point in the specification. Since this series arm consists of a finite length of transmission line, there is an inductance in series with the capacity (since these lines have very low resistance, all lines are assumed to be lossless). However this inductance can be readily compensated for over a restricted frequency band by making the actual condensers of such a value that the impedance of the series arm is effectively equal to the required value.

The shunt arm must be equivalent to a series LC circuit, with L equal to $L_{2k}/m$ and C equal to $$\frac{4_m}{1-m^2}C_{1k}$$

The impedance variation with frequency of the transmission line is considerably different than that of the lumped circuit but by employing a dual impedance line for the shunt elements the desired impedance characteristic in a limited frequency band can be obtained. Such a configuration is illustrated in Figure 5 where the shunt arms each comprise a first segment having respective characteristic impedances of $Z_{01}$ and a second segment each of respective characteristic impedance $Z_{02}$.

Physically this is accomplished by sliding a metallic sleeve over the inner conductor, thereby changing the outer-to-inner diameter ratio and hence the characteristic impedance for a portion of the line. By a proper selection of $Z_{01}$ and $Z_{02}$ and the length of each of the respective segments, an impedance versus frequency characteristic can be attained which closely matches the characteristic of the theoretical filter elements in the desired frequency band.

Figure 7:
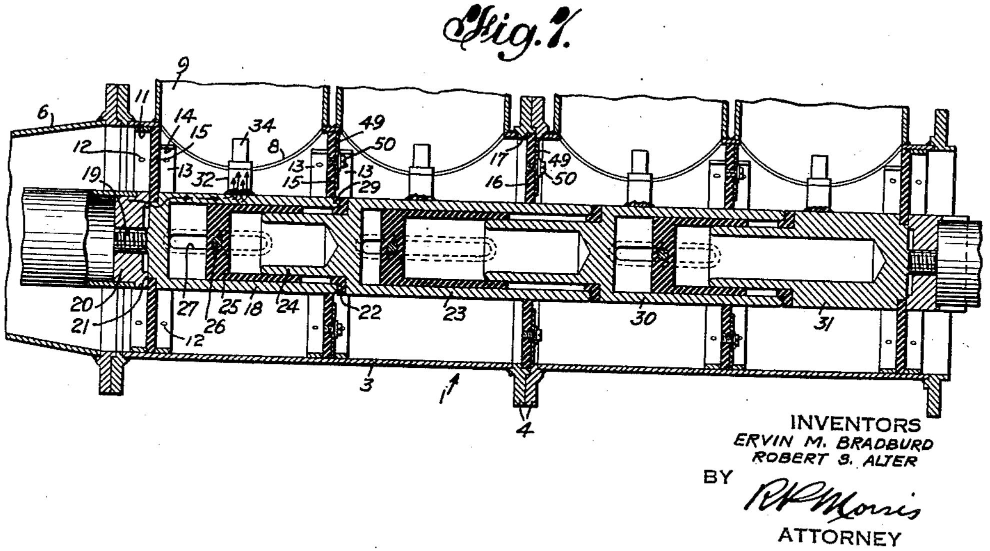
Figure 7 is a detailed view in section of the series arm construction utilized in the embodiment of the invention illustrated in Figure 6.
Figure 6:
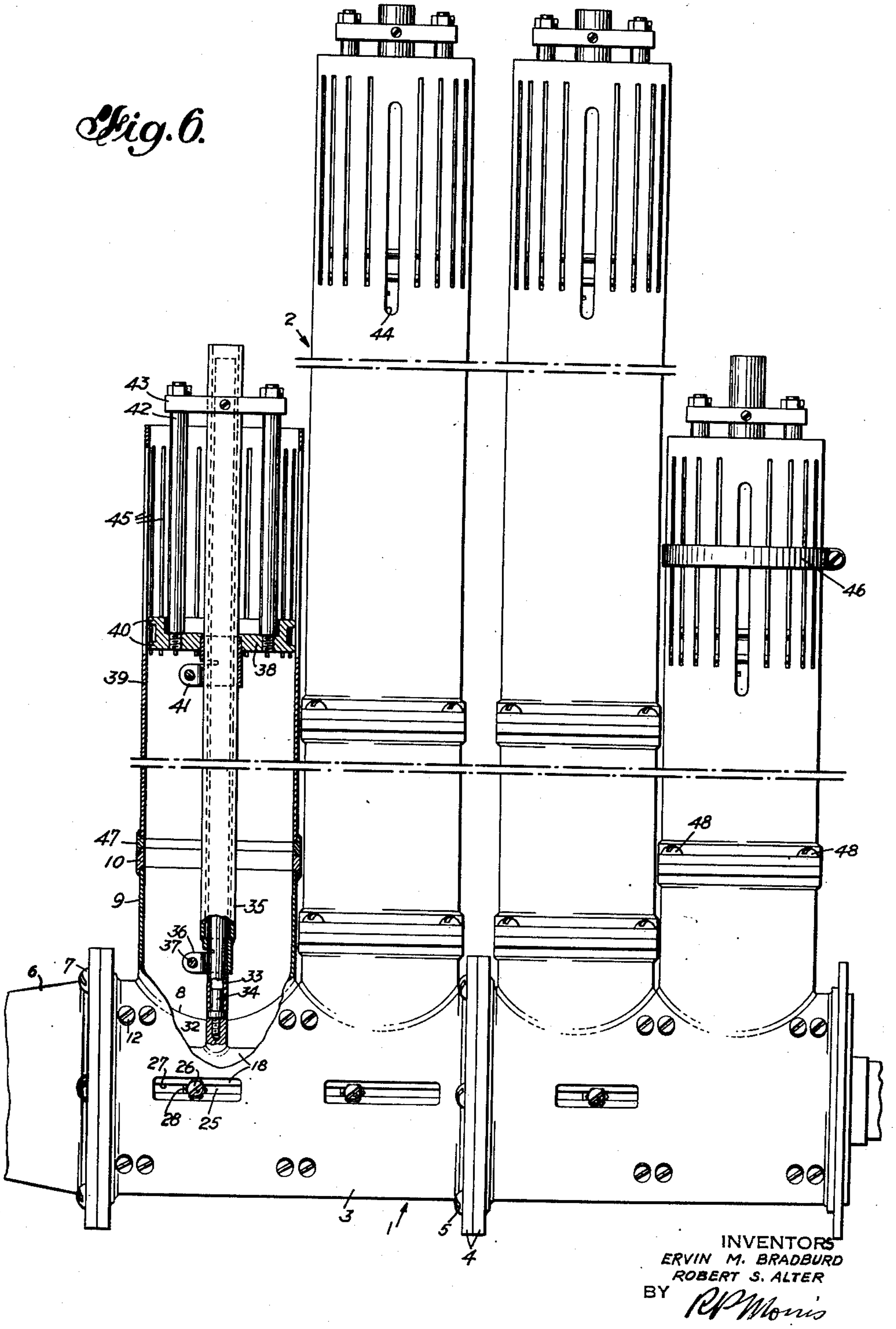
Figure 6 is an elevational view, partly in section, of a filter embodiment according to the present invention showing the detailed constructional features employed.

The detailed construction of an embodiment of the invention will now be considered with reference to Figures 6 and 7 of the drawings.

The filter, according to the present embodiment of the invention, comprises broadly the series arm assembly 1 and the four shunt arm assemblies designated by the same reference character 2.

The series arm assembly as seen in Figure 7 comprises an outer cylindrical tube element 3 which for convenience in manufacturing is formed in two identical segments each provided with joining flanges 4 which are secured together by means of the bolts 5.

The diameter of the inner transmission line used in the filter must be sufficiently large to exceed the corona break-down voltage in the series condensers which are built in a re-entrant manner into the inner line. The outer diameter should be such that the characteristic impedance of the line is equal to the desired value. Since standard-coaxial line is used for both input and output of the filter, and the filter elements themselves require larger dimensioned sections than these standard lines due to the considerations above, a tapered constant impedance line 6 is used to match the filter physically to its input and output connections. The tapered line 6 is attached to the end portions of the element 3 by means of the bolt 7, in a similar manner to that utilized in joining the individual half sections of the element 3 together.

Each of the identical tube segments forming the assembly 3 are cut out at two points, as along the lines 8, to receive the shunt arm cylindrical attachment stubs 9, of which there are four disposed at approximately equal distances along the tube.

These attachment stubs may be soldered or secured in any other suitable manner to the tube 3. The attachment stubs are provided with joining flanges 10 which are used to secure the remainder of the shunt arm 2 to the stubs upon final assembly as will be described later. It may readily be seen that by providing such an arrangement the manufacture of the filter is greatly simplified as the series arm assembly 1 may be completed without the danger of damaging the shunt arms 2 during the process.

Adjacent each of the ends of the cylindrical tube element 3, there is provided a first concentric metallic ring member 11 which is secured to the tube 3 by means of the bolts 12, spaced at equal distances around the outer circumference of the tube. Adjacent this ring member and spaced apart therefrom is a second metallic ring member 13 which is secured to the tube 3 in the same manner as ring 11. However, the ring 13 is disposed at that point in the tube 3 which is removed to receive the attachment stubs 9 as has been explained above and therefore the ring is cut away partially as shown at 14 so as to allow attachment of the stub. Between the metallic rings there is provided an insulating disc spacer member 15, which extends around the circumference of the tube 3 and is held in place by the rings 11 and 13 which abut against the spacer on either side thereof. The next spacer in from each of the ends of the tube 3, which has been designated by the same reference character 15, are each supported by two metallic ring members of the type 13, since the location of the spacers are such with respect to the shunt arm attachment stubs 9, that both must be cut away on a portion of their circumference so as to prevent interference with the attached stubs. At the midpoint of the two tube segments 3, where the segments are joined by the flanges 4, an insulating spacer 16 is provided, which is held in place by means of a shoulder 17 which is cut-out of the joining flanges 4 to receive the spacer. The mating of the flanges on opposing tube segments is such as to securely position the spacer 16 when the segments are joined. The spacers 15 and 16 are cut-out at their center portions to support the inner conductor arrangement of the series arm coaxial line.

The first segment of this inner conductor as designated by the reference character 18, is a cylindrical metallic member, preferably of brass, which is cut-out at one end, to be received by the spacer member 15. The opposite end of this segment extends through the next spacer 15 and is held rigidly between the spacers. The conductor 18 carries a threaded extension 19 which extends outwardly along the major axis of the assembly. This extension is adapted to engage a cylindrical conductor member 20, which is tapped at its center portion. The member 20 is threaded onto the extension 19 until the two conductor segments are drawn into contact at the point 21 extending around the circumferences of both segments.

In Figure 7 a plurality of small arrows have been superimposed upon the inner conductor member to indicate the probably current distribution along these conductors. In order to provide for a through current path at the point 21 the corners of the contacting surfaces are made very sharp as indicated in the drawing.

The conductor segment 18 at its other end, abuts against an insulator ring spacer 22, which is adapted to insulate this segment from the next adjoining segment 23. This is done to allow for the required series capacitive coupling, the construction of which will now be considered with reference to the detailed sectioned drawing Figure 7.

Like elements shown in Figure 7 which have been discussed in the above consideration bear the same reference characters. As shown, the conductor segment 18 is hollowed out to receive an extension 24 provided on the adjacent conductor segment 23. This extension is likewise hollowed out for lightening purposes. The mating of the conductor segment 18 and the extension 24 on segment 23 is such as to allow the insertion of a cylindrical dielectric tuning element 25, of any suitable material such as for instance "Teflon," which does not carbonize and hence will not be damaged by any temporary high voltage condition. The dielectric tuning element 25 is fitted and inserted in the space provided between the inner circumference of the cut-out segment 18 and the outer circumference of the extension 24 on segment 23 in such a manner as to be movable axially in this space for tuning purposes. It may be readily seen that displacement of the member 25 into the space between segments 18 and 23 will change the dielectric constant between segments and provide tuning of the capacitor arrangement.

In order to allow ready access to this tuning arrangement when the inner conductors are assembled in the tube 3, a bolt 26 is passed through the tuning element 25 and extends radially from this element to the outer surface of segment 18. Segment 18 is slotted on both sides 27 for substantially the allowable length of travel of the member 25. One slot receives the head of bolt member 26 in slideable engagement and the opposing slot carries a nut 28 for engaging the bolt and thereby securing the tuning member in any desired position. The outer tube 3 is provided with slots in order to gain access to the tuning arrangement after assembly as shown in Figure 6. As has been previously explained the ring spacer 22 in conjunction with the spacer 15 insures against any radial movement of the inner conductor while the end spacers 15 prevent any possible axial displacement of the assembly.

In order to prevent any current accumulation between opposing edges of the conductor segments 18 and 23 which form the physical plates of the series condensers the corners are rounded to remove these possible trouble points as shown at 29 in Figure 7.

The series arm of the filter has three condensers built in this same re-entrant manner and for convenience in identifying them the drawings have been labeled such that corresponding parts of each condenser bear the same reference characters.

Each of the inner conductor elements 8, 23, 30 and 31 (Figure 7), of the series arm have secured thereto at a point directly below the shunt arm attachment stubs 9, a cylindrical boss 32 which is internally tapped as best seen in the detailed view Figure 6. These bosses are provided for attaching the first lengths of inner conductor in the shunt arms. Since the four shunt arms are substantially identical in respect to constructional features, only one of the arms will be considered. It must be understood however that the impedance and hence the dimensions of these arms are entirely dependent on the particular design values desired and are being considered here as identical only for a structural explanation.

With reference to Figure 6 the left hand shunt arm has been shown sectioned along its length. The first inner conductor tube 33 is provided with a press fit threaded extension 34 which is adapted to be received in the tapped boss 32 carried by the individual segment 18. This supports the conductor 33 which extends upwardly through the attachment stub 9. The second length of conductor 35 is slipped over conductor 33 and for tuning purposes is made adjustable thereon. Secured to the second length of conductor 35 at its lower end by any suitable means is an adjustment clamp 36 which is provided with an adjustment bolt 37. The conductor 35 may be moved axially along the first conductor 33 and then clamped at any desired position.

For additional tuning purposes the second conductor 35 is provided with a shorting piston which is adjustable along its length. The shorting piston comprises a cylinder disc 38 which is adapted to engage the side walls of the outer conductor 39. The contact surface of the disc 38 is cut-back and rounded to provide ease in moving as shown at 40. The disc is secured to an adjustable clamping member 41 similar to clamp 36 which is moveable along the conductor 35. Two extension rods 42 are mounted on the disc 38 and extend upwardly out of the outer conductor tube 39 and are secured to a cross brace 43 which is free to move along the conductor 35. This arrangement has a dual purpose in that it allows easy accessibility to the shorting piston and supports the piston within the tube 39. In order to provide access to the adjustment clamp 41 the side wall of conductor tube 39 is slotted as at 44. In addition if it be desirable the side wall may be provided with the slots 45 and an outwardly accessible clamp as for instance 46 may be used for adjusting the shorting piston.

As has been previously mentioned in order to simplify the assembly of the composite filter the outer conductor tubes 39 may be cut off at any desired length and assembled in sections by means of the joining flanges 10. For instance the shunt arm under discussion is provided with one such sectional connection, wherein the flange 47 carried by the upper tube segment 39 is adapted to be connected to the flange 10 carried on the attachment stub 9 by means of the bolts 48. The sectioning of this outer conductor would depend entirely on what lengths would be convenient to handle for a particular filter design.

Since the shunt arms are shorted at the far end and represent a series resonant circuit there is a high current point on each of the shunt arms where they join the respective series segment or more particularly at the points where the cylindrical bosses 32 are secured to segments 18, 23, 30 and 31 as has been indicated by the superimposed arrows at these points. This would ordinarily produce a very undesirable effect since the shunt arms are relatively close together and considerable inductive coupling between adjacent shunt arms would occur. This effect is counteracted in the filter by placing thin sheets of copper on the spacers between adjacent shunt arms. In addition to producing this desired effect the spacers assure concentricity of the inner line.

The arrangement as illustrated in Figure 7 comprises the thin copper sheets 49 which are secured to the spacers 15, and 16 by means of the bolts 50. The copper sheets 49 are grounded to the outer conductor along their entire periphery and are extended to within a very close distance of the inner conductor, thus effectively shielding the various portions of the filter from each other.

In Figure 1 there is shown for comparative purposes a response curve C that was attained with a filter unit built according to the present invention. As seen from this curve, the response is flat to within 2 db from minus 0.75 megacycle to plus 4 megacycles of the carrier frequency, while a drop of better than 20 db is achieved between minus 0.75 megacycle and minus 1,25 megacycles. The attenuation of the filter exceeds 20 db for all frequencies lower than 1.25 megacycles below the visual carrier.

While I have described above the principles of my invention in connection with a specific embodiment it is to be clearly understood that this description is made only by way of example and not as a limitation to the scope of my invention.

We claim:

A vestigial sideband filter of the type employing transmission line impedance elements comprising, a first coaxial line having a plurality of re-entrant capacitive elements coupled in series therewith, means for individually varying the capacity of said capacitive elements, a plurality of second coaxial lines coupled to said first coaxial line, each of said second coaxial lines having dual line inner conductors, said dual line comprising a first inner conductor connected in shunt to said first coaxial line, a second inner conductor partially surrounding and connected in series with said first inner conductor, means for varying the position of said second inner conductor with respect to said first inner conductor, to vary the effective impedance of said dual line inner conductors, a movable tuning element coupled to each of said second coaxial lines for varying the effective impedance thereof, and means for magnetically insulating portions of said second coaxial lines from each other.

References Cited in the file of this patent

UNITED STATES PATENTS

| Number | Name | Date |
|---|---|---|
| 248,742 | Henck | Oct. 25, 1881 |
| 1,493,600 | Campbell | May 13, 1924 |
| 2,066,674 | Dunmore | Jan. 5, 1937 |
| 2,132,208 | Dunmore | Oct. 4, 1938 |
| 2,284,529 | Mason | May 26, 1942 |
| 2,290,508 | Usselman et al. | July 21, 1942 |
| 2,515,061 | Smith | July 11, 1950 |

FOREIGN PATENTS

| Number | Country | Date |
|---|---|---|
| 590,474 | Great Britain | July 18, 1947 |
| 609,231 | Great Britain | Sept. 28, 1948 |

OTHER REFERENCES

Publication — Communication Engineering, Everett, McGraw Hill Co., 1937, pages 179–216.

Article—Microwave Filters Using Quarter-Wave Couplings by Fano et al. in Proc. of the I. R. E., vol. 35, No. 11, November, 1947, pages 1318–1323.